United States Patent
Hähnel

(10) Patent No.: US 10,256,080 B2
(45) Date of Patent: Apr. 9, 2019

(54) APPARATUS FOR THE PLASMA TREATMENT OF SURFACES AND A METHOD FOR TREATING SURFACES WITH PLASMA

(71) Applicant: tesa SE, Norderstedt (DE)

(72) Inventor: Marcel Hähnel, Norderstedt (DE)

(73) Assignee: TESA SE, Norderstedt (DE)

( * ) Notice: Subject to any disclaimer, the term of this patent is extended or adjusted under 35 U.S.C. 154(b) by 123 days.

(21) Appl. No.: 14/920,955

(22) Filed: Oct. 23, 2015

(65) Prior Publication Data

US 2016/0118230 A1    Apr. 28, 2016

(30) Foreign Application Priority Data

Oct. 23, 2014   (DE) .................... 10 2014 221 521

(51) Int. Cl.
| | | |
|---|---|---|
| *H01J 37/32* | (2006.01) | |
| *H05H 1/24* | (2006.01) | |

(Continued)

(52) U.S. Cl.
CPC ........ *H01J 37/32568* (2013.01); *B29C 59/14* (2013.01); *C09J 5/02* (2013.01);
(Continued)

(58) Field of Classification Search
CPC .. B05D 3/141; B29C 59/14; H01J 2237/3322; H01J 2237/336; H01J 37/3244; H01J 37/32541; H01J 37/32568; H01J 37/32036; H01J 37/32055; H01J 37/32073; H01J 37/32348; H05H 1/2406; H05H 1/26; H05H 1/30; H05H 2001/2418; H05H 2001/2431
See application file for complete search history.

(56) References Cited

U.S. PATENT DOCUMENTS

| | | | | |
|---|---|---|---|---|
| 5,837,958 A | * | 11/1998 | Fornsel ................. | B08B 7/0035 219/121.4 |
| 2007/0104610 A1 | * | 5/2007 | Houston ................. | A61L 2/14 422/22 |
| 2013/0153545 A1 | * | 6/2013 | Kim ........................ | A61N 1/44 219/121.5 |

FOREIGN PATENT DOCUMENTS

| | | |
|---|---|---|
| DE | 19532412 A1 | 3/1997 |
| DE | 102009025065 A1 | 9/2010 |

(Continued)

OTHER PUBLICATIONS

Machine translation of FR-2443753.*

(Continued)

*Primary Examiner* — Dah-Wei D. Yuan
*Assistant Examiner* — Jose Hernandez-Diaz
(74) *Attorney, Agent, or Firm* — Norris McLaughlin, P.A.

(57) ABSTRACT

Apparatus and method for the plasma treatment of surfaces with a first electrode and a second electrode, the apparatus and method comprises an alternating voltage source between the first and second electrodes, and an electrical field forming, at least between the first and second electrodes, an effective area, which is arranged in front of the first electrode and in which the surface to be treated can be positioned, wherein the second electrode is arranged closer to the effective area than the first electrode. The apparatus and method provides at least one process gas channel for at least one stream of process gas with at least one outlet at the first electrode, wherein the at least one outlet points in the direction of the effective area, the at least one stream of process gas impinges on the electrical field, the electrical field converts the at least one stream of process gas into a stream of plasma, and the stream of plasma impinges on the effective area.

4 Claims, 3 Drawing Sheets

(51) Int. Cl.
*C09J 5/02* (2006.01)
*B29C 59/14* (2006.01)
*B05D 3/14* (2006.01)

(52) U.S. Cl.
CPC .... *H01J 37/3244* (2013.01); *H01J 37/32541* (2013.01); *H05H 1/2406* (2013.01); *B05D 3/144* (2013.01); *H01J 2237/336* (2013.01); *H01J 2237/3322* (2013.01); *H05H 2001/2418* (2013.01); *H05H 2001/2431* (2013.01)

(56) References Cited

FOREIGN PATENT DOCUMENTS

| EP | 0497996 A1 | 8/1992 | | |
|---|---|---|---|---|
| FR | 2443753 A1 | * | 7/1980 | ............. H01T 19/04 |
| FR | 2443753 A1 | | 7/1980 | |
| WO | 2014/029999 A1 | | 2/2014 | |

OTHER PUBLICATIONS

EPO Search Report for corresponding EP Application No. 15188751.0 dated Apr. 1, 2016.
Friedrich, Joerg, "The Plasma Chemistry of Polymer Surfaces," Wiley-VCH Verlag GmbH & Co. KGaA, 2012, pp. 10-31 and 54-67, Weinheim, Germany.
Wagner, et al., "The Barrier Discharge: Basic Properties and Applications to Surface Treatment," Elsevier Science Ltd., 2003, Vacuum vol. 71, pp. 417-436, Greifswald, Germany.
German Office Action for corresponding DE Application No. DE 10 2014 221 521.8 dated Aug. 4, 2015.

* cited by examiner

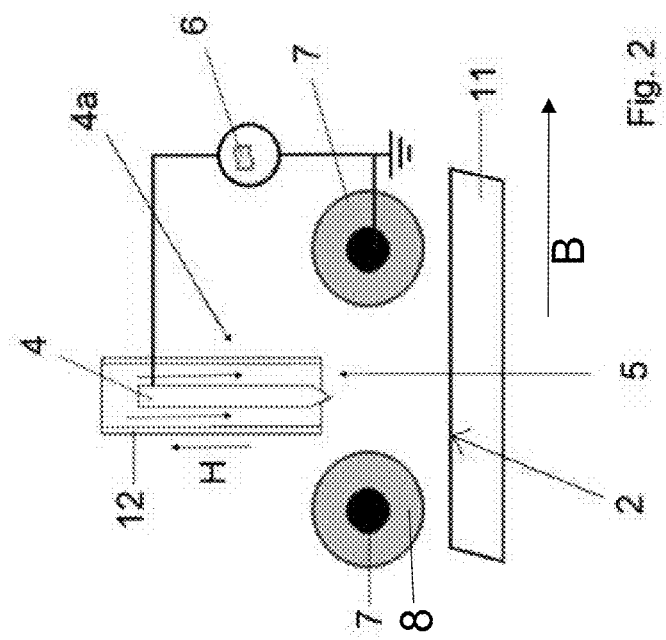
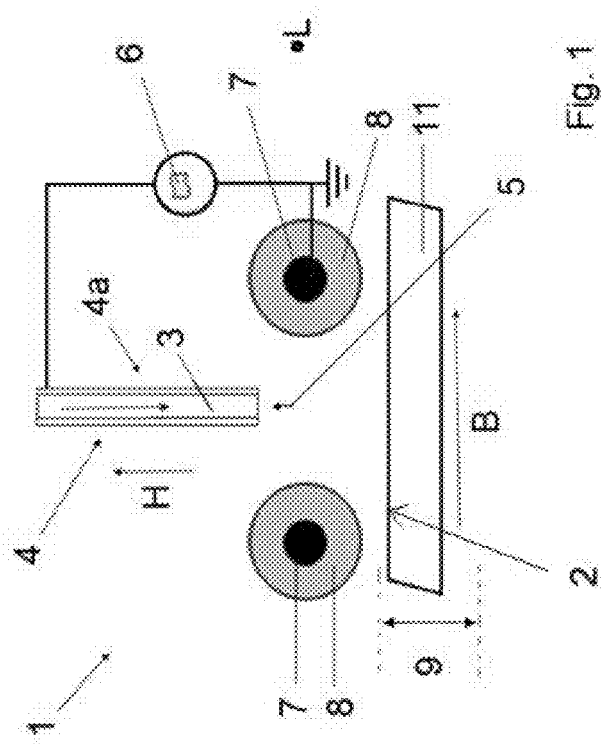

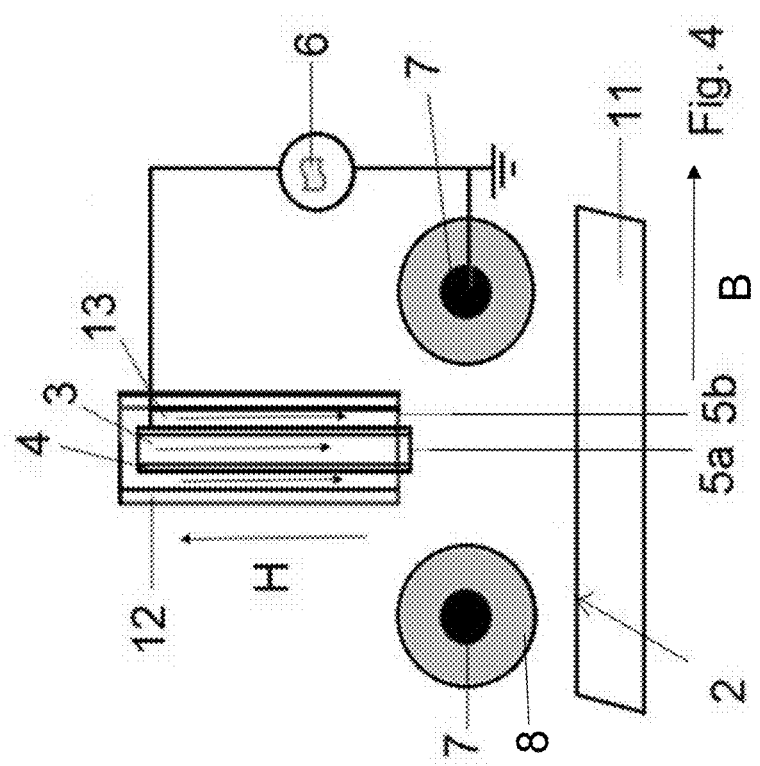
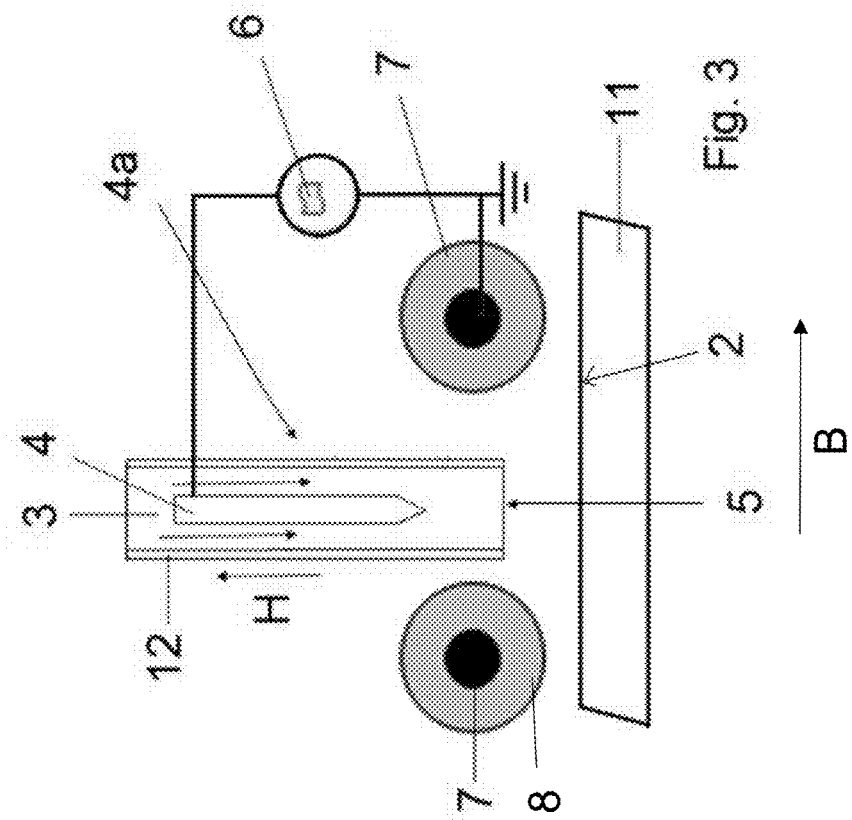

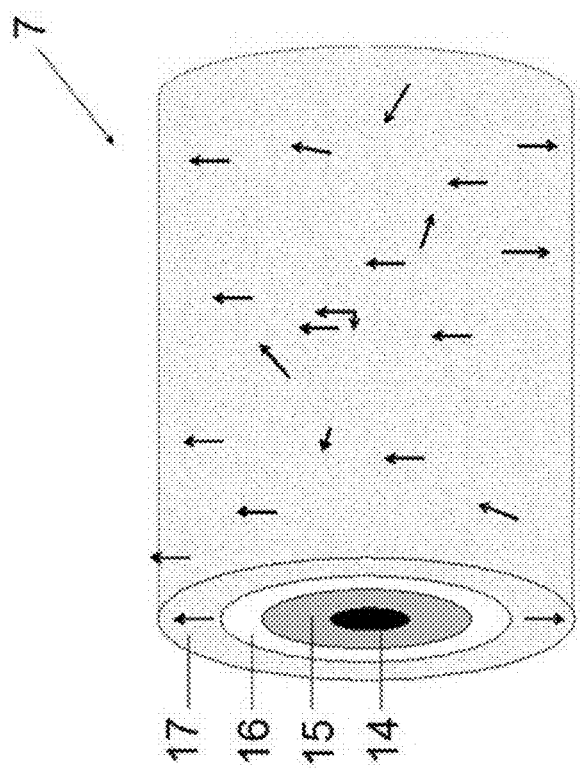
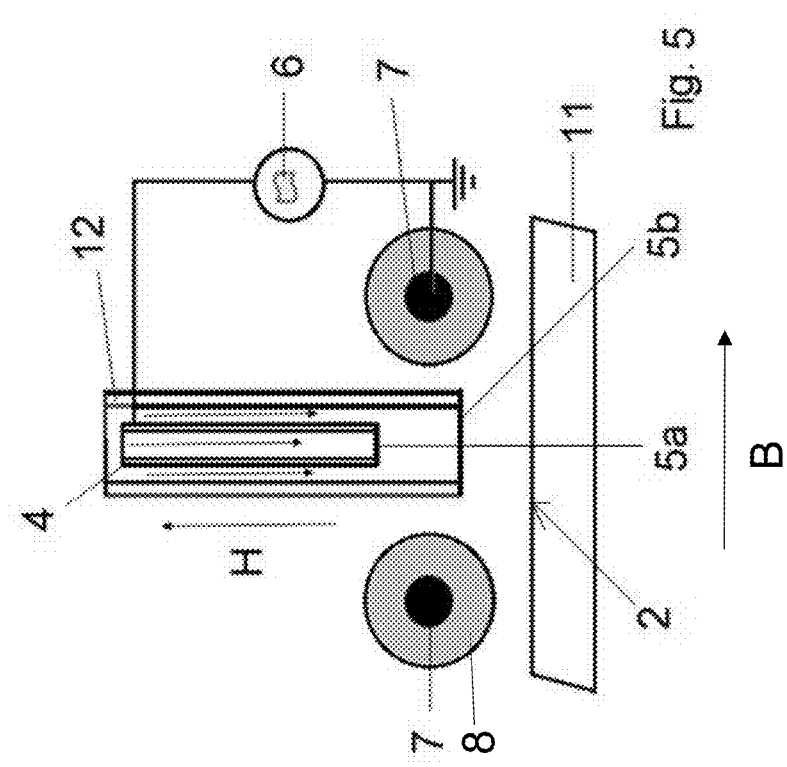

APPARATUS FOR THE PLASMA TREATMENT OF SURFACES AND A METHOD FOR TREATING SURFACES WITH PLASMA

The invention relates to an apparatus for the plasma treatment of surfaces, with a first electrode and a second electrode and an alternating voltage source between the first electrode and the second electrode and an electrical field, forming between the first electrode and the second electrode, and with an effective area, which is arranged in front of the first electrode and in which the surface to be treated can be positioned, the second electrode being arranged closer to the effective area than the first electrode.

The invention also relates to a method for treating surfaces with plasma, in that an alternating voltage is applied between a first electrode and a second electrode, an alternating electrical field is generated between the two electrodes, a surface to be treated is positioned in front of the first electrode and the second electrode is arranged closer to the surface than the first electrode.

When sticking surfaces one on top of the other by means of adhesives, there is always the problem of applying the adhesives durably and firmly to the surface of the substrate. Particularly high adhesion of the pressure-sensitive adhesive to the surface is necessary for this. The term "adhesion" usually means the physical effect by which two phases brought into contact with one another are held together at their interface by virtue of intermolecular interactions arising there. The adhesion therefore determines the extent of bonding of the adhesive on the substrate surface, and can be determined in the form of what is known as "tack" and in the form of bond strength. Plasticizers and/or "tackifier" resins are often added to the adhesive in order to exert a controlled effect on its adhesion.

Adhesion can be defined in simple terms as "the interaction energy per unit of area" [in mN/m], but this is not measurable because of experimental restrictions, for example lack of knowledge of the actual contact areas. Surface energy (SE) is also often described by using "polar" and "nonpolar" components. This simplified model is now well accepted for practical purposes. This energy and its components are often measured by measuring the static contact angle of various test liquids. The surface tensions of these liquids are divided into polar and nonpolar components. The polar and nonpolar components of the surface energy of the test surface are determined from the observed contact angles of the droplets on the test surface. By way of example, the OWKR model may be used here. An alternative method conventionally used in industry is determination by means of test inks in accordance with DIN ISO 8296.

In the context of such discussions, the terms "polar" and "high-energy" are often treated as equivalent, as also are the terms "nonpolar" and "low-energy". This derives from the fact that polar dipole forces are large in comparison with what are known as "disperse" or "nonpolar" interactions, which do not involve permanent molecular dipoles. The basis for this approach to surface energy and surface interactions is the assumption that polar components interact only with polar components and nonpolar components only with nonpolar components.

However, it is also possible that a surface has small or moderate polar surface energy components without "high" surface energy. A guideline that can be used is: as soon as the polar component of the SE is greater than 3 mN/m, the surface can be referred to as "polar" for the purposes of this invention. This corresponds approximately to the practical lower detection limit.

In principle, there are no specific boundaries for terms such as "high-energy" and "low-energy". For the purposes of discussion, the limit is set at 38 mN/m or 38 dyn/cm (at room temperature). This is a value above which for example of the printability of a surface is usually adequate. The surface tension (=surface energy) of pure water can serve for comparison, and is about 72 mN/m (being inter alia temperature dependent).

In particular on low-energy substrates such as PE, PP over EPDM, but also many coating materials, major problems arise in achieving satisfactory adhesion when pressure-sensitive adhesives or other adhesives or coatings are used.

The physical pretreatment of substrates (for example by flame, corona, or plasma) to improve adhesive bond strengths is especially customary with liquid reactive adhesives.

One function of this physical pretreatment can also be cleaning of the substrate, for example to remove oils, or roughening to enlarge the effective surface area.

The term mostly used for physical pretreatment is "activation" of the surface. This mostly implies a non-specific interaction, contrasting by way of example with a chemical reaction using the key-in-lock principle. Activation mostly implies an improvement in wettability, printability, or anchoring of a coating.

In the case of self-adhesive tapes, it is customary to apply an adhesion promoter to the substrate. However, this is often a complicated manual step that is susceptible to error.

Use of physical pretreatment of the substrate (flame, corona, or plasma) to improve the adhesion of pressure-sensitive adhesives has not achieved universal success, since nonpolar adhesives such as natural or synthetic rubber typically do not profit from that process.

Corona treatment is defined as a surface treatment which uses filamental discharges and which is generated via high alternating voltage between two electrodes, whereupon the discrete discharge channels come into contact with the surface requiring treatment, in which connection see also Wagner et al., Vacuum, 71 (2003), pp. 417 to 436. The process gas can be assumed to be ambient air unless otherwise stated.

In particular, in industrial applications the term "corona" mostly means a "dielectric barrier discharge" (DBD). At least one of the electrodes here is composed of a dielectric, i.e. of an insulator, or has a coating or covering of the same. The substrate may also act here as a dielectric.

The treatment intensity of a corona treatment is given as the "dose" in [Wmin/m$^2$], with the dose D=P/b*v, where P=electrical power [W], b=electrode width [m], and v=web speed [m/min].

The substrate is almost always placed within, or passed through, the discharge space between an electrode and an opposing electrode, this being defined as "direct" physical treatment. Substrates in web form here are typically passed between an electrode and an earthed roll. Another term that is also sometimes used is "ejected corona" or "single-side corona". This is not comparable with a direct physical treatment since high gas flows are required here according to the prior art in order to drive out the plasma from the electrode arrangement as effluent in the direction of the substrate or so that irregular discharge filaments are "ejected" together with a process gas, and it is impossible to achieve stable, well-defined, efficient treatment.

FR 2 443 753 discloses an apparatus for surface treatment by means of a corona discharge. In this case, the two electrodes are arranged on the same side of the surface to be treated of the object, the first electrode being formed by a multiplicity of tips, along which a curved arrangement of a second electrode is provided. An alternating voltage of 12 kV at a frequency of 40 kHz is applied between the two electrodes. The corona discharge along the field lines thereby influences the surface passed by and leads to activation of the surface, whereby the bonding properties of a pressure-sensitive adhesive on the surface treated by the corona effect are improved.

A more uniform intensive corona treatment of materials of various kinds, forms and thicknesses can be made possible by completely avoiding the corona effect on the surface of the material to be treated, in that, according to EP 0 497 996 B1, a dual-pin electrode is chosen, each of the pin electrodes having a channel of its own for pressurization. Between the two tips of the electrodes there is produced a corona discharge, which ionizes the stream of gas flowing through the channels and converts it into a plasma. This plasma then reaches the surface to be treated, where it carries out in particular a surface oxidation that improves the wettability of the surface. The type of physical treatment is referred to (here) as indirect because the treatment is not performed at the location where the electrical discharge is produced. The treatment of the surface takes place at or near atmospheric pressure, but the pressure in the electrical discharge space or gas channel can be increased.

The plasma device of EP 0 497 996 B1 has quite high gas flows in the range of 36 $m^3$ per hour with a 40 cm electrode width per gap. The high flow velocities result in a low dwell time of the activated constituents on the surface of the substrate. Furthermore, it is also the case that only those constituents of the plasma that are correspondingly long-living and can be moved by a stream of gas reach the substrate. Electrons for example cannot be moved by a stream of gas, and therefore do not play any part.

The plasma is understood here as being an atmospheric pressure plasma, which is an electrically activated homogeneous reactive gas that is not in thermal equilibrium, with a pressure close to (+/−0.05 bar) or at atmospheric pressure or ambient pressure in the effective area. The electrical discharges and ionizing processes in the electrical field have the effect that the gas is activated, and highly excited states are produced in the gas constituents. The gas used and the gas mixture are referred to as the process gas. In principle, gaseous substances such as siloxane, acrylic acids or solvents or other constituents may also be admixed with the process gas. Constituents of the atmospheric pressure plasma may be highly excited atomic states, highly excited molecular states, ions, electrons, or unchanged constituents of the process gas. The atmospheric pressure plasma is not produced in a vacuum, but usually in ambient air. This means that, if the process gas is not already air itself, the outflowing plasma at least contains constituents of the surrounding air or is surrounded by it.

In the case of a corona discharge as defined above, the high voltage applied causes formation of filamental discharge channels with electrons and ions. The low-mass electrons in particular encounter the surface at high velocity with energies that are sufficient to break most of the molecular bonds. The broken bond sites then react further with constituents of the air or of the process gas. An effect of decisive importance is the formation of short-chain degradation products via electron bombardment. Treatments of higher intensity also cause significant ablation of material.

The reaction of a plasma with the substrate surface promotes the direct "incorporation" of the plasma constituents. Alternatively, it is possible that an excited state or an open bond site and radicals are produced on the surface and that these then undergo secondary further reaction, for example with atmospheric oxygen from the ambient air. In the case of some gases, such as noble gases, no chemical bonding of the process gas atoms or process gas molecules to the substrate is to be expected. The activation of the substrate here takes place exclusively by way of secondary reactions.

In the case of indirect plasma treatment, free electrons are possibly present, since the treatment takes place outside the generating electrical field, but this depends on the type of plasma propagation.

The object of the present invention is to provide an apparatus of the type mentioned at the beginning that makes indirect corona treatment of a surface possible with no flow velocity or a very low flow velocity.

The object of the invention is also to provide a method of the type mentioned at the beginning that avoids the disadvantages mentioned, such as a high flow velocity, and consequently high gas consumption, and also likewise avoids damage to the rear side of the substrate.

With regard to the apparatus, the object is achieved by an apparatus mentioned at the beginning with the characterizing features of claim 1.

The apparatus is delimited with respect to FR 2 443 753 as the closest prior art. The apparatus according to the invention is distinguished by at least one process gas channel for at least one stream of process gas, with an outlet for each tip at a first electrode, the outlet pointing in the direction of the effective area and the at least one stream of process gas impinging on the electrical field and the electrical field converting the at least one stream of process gas into a stream of plasma, preferably precisely one stream of plasma, and the stream of plasma impinging on the effective area.

As compared with the direct corona treatment of FR 2 443 753, according to the invention a treatment of the surface of a substrate is performed by means of a stream of plasma, the plasma preferably being an atmospheric pressure plasma that is referred to here as plasma for short, and being produced by a corona discharge between a first electrode and a second electrode. The at least one process gas channel runs along the first electrode and the at least one stream of process gas is converted in the at least one process gas channel into a stream of plasma. Because the second electrode is arranged closer to the effective area than the first electrode, the field lines of the apparatus put into operation point predominantly in a direction towards the effective area, so that a field-line-driven advancement of the plasma takes place in the direction of the effective area even at very low process gas flow velocities or no process gas flow velocity. As a result, the process gas flow velocity can be advantageously reduced, and a targeted surface activation is nevertheless possible as a result of the plasma movement in the direction of the effective area.

In the sense of the invention, the process gas merely serves the purpose of being able to produce particular species.

The first electrode is preferably formed as a rod and is arranged in the interior of the process gas channel. In the case of this embodiment, precisely one process gas channel and precisely one stream of process gas are advantageously provided. As a result, it is possible that the process gas flows around the first electrode and a particularly high proportion of it is converted into plasma. The process gas indeed does not serve the purpose of driving the plasma out of the plasma source in the direction of the substrate.

In a further embodiment of the invention, the first electrode is formed as a tube and encloses a further process gas channel. The tube-shaped electrode is preferably also arranged centrally in the process gas channel. The process gas channel and the further process gas channel are separate from one another and aligned parallel to one another. In this case, the further process gas channel is provided in the interior of the tube-shaped electrode, and the electrode is enclosed on the outside by the process gas channel. The process gas channel is surrounded by an enclosure and is formed through it.

The first electrode preferably reaches up closer to the effective area than the enclosure. The first electrode in this case protrudes beyond the enclosure along a direction of the height towards the effective area.

It is however also possible that, in another embodiment of the invention, the electrode is made shorter than the enclosure in the direction of the height, and therefore the enclosure reaches up closer to the effective area than the first electrode. The different length of the electrode in comparison with the enclosure can be chosen both in the case of a rod-shaped first electrode and in the case of a tube-shaped first electrode.

The different length and number of the process gas channels makes it possible to provide an individually tailored apparatus for the treatment of a surface, according to requirements.

It has been found in the case of coating plasma systems that the plasma-activated gas impinging on the surface of the substrate can, after depositing matter there, also be swirled back again in the direction of the electrodes, and over the course of time a coating likewise forms there. In order to reduce or even eliminate the risk of coating, the second electrode is advantageously formed as a rod and surrounded by a gas-tight inner layer, and a gas channel is provided between the gas-tight inner layer and a gas-permeable dielectric outer layer. The gas channel is independent of the process gas channel. The second electrode is preferably the earthed electrode. It is surrounded by a gas-tight inner layer, so that the gas between the gas-tight inner layer and the gas-permeable dielectric outer layer in turn enclosing the gas-tight inner layer cannot reach the electrode, but instead only flows away from the second electrode through the gas-permeable dielectric outer layer. This stream away from the second electrode has the effect of counteracting deposition of the reflected plasma.

With particular preference, the apparatus has not only a single first electrode and precisely one or precisely two second electrodes, but a multiplicity of first electrodes in a number of rows that are respectively aligned in a longitudinal direction and are arranged one behind the other, and a number of rod-shaped second electrodes, which respectively run in the longitudinal direction along one of the rows of first electrodes. In this embodiment of the invention, an entire grid of first electrodes is provided, whereby a treatment of the surface over a large area is made possible.

With regard to the method, the object is achieved by a method mentioned at the beginning with the characterizing features of claim 9.

The method is suitable in particular for being carried out with one or more of the aforementioned apparatuses. In the case of the method mentioned at the beginning, at least one stream of process gas is passed through at least one process gas channel. The at least one process gas channel has at least one outlet. The at least one stream of process gas leaves the at least one outlet in the direction of the effective area, and the at least one stream of process gas impinges on the electrical field, and the electrical field converts the at least one stream of process gas into a plasma space, and the plasma impinges on the effective area. The surface of the substrate is preferably arranged in the effective area, and the stream of plasma impinges on this surface and activates the surface, in that it for example activates the surface or carries out on the surface other known physical reactions that increase the bonding force of a pressure-sensitive adhesive. These types of activations are known in principle from Jörg Friedrich, "The Plasma Chemistry of Polymer Surfaces", Wiley-VCH Verlag GmbH & Co. KGaA, Weinheim, 2012.

The stream of process gas advantageously flows on the outside around the first electrode formed as a rod, but it is also conceivable that a further stream of process gas flows through the interior of the electrode formed as a tube.

In one embodiment of the invention, the further stream of process gas ends within the enclosure and goes over into the stream of process gas, whereas in another embodiment of the method according to the invention the rod-shaped electrode is made longer than the enclosure of the electrode, so that the further stream of process gas ends outside the enclosure and only mixes with the stream of process gas at a later point in time and at a smaller distance from the surface of the substrate.

The second electrode is advantageously configured in one of the aforementioned embodiments, and a stream of gas flows along the second electrode and through a gas-permeable dielectric outer layer to the outside, so that deposits of the plasma on the second electrode can be prevented.

The invention is described on the basis of several exemplary embodiments in six figures, in which:

FIG. 1 shows an apparatus according to the invention for the plasma treatment of surfaces in a first embodiment;

FIG. 2 shows a second embodiment of the apparatus for the plasma treatment of surfaces;

FIG. 3 shows a third embodiment of the apparatus for the plasma treatment of surfaces;

FIG. 4 shows a fourth embodiment of the apparatus for the plasma treatment of surfaces;

FIG. 5 shows a fifth embodiment of the apparatus for the plasma treatment of surfaces; and FIG. 6 shows a perspective view of an earthed electrode of one of the embodiments in FIGS. 1 to 5.

The first embodiment, schematically represented in FIG. 1, of an apparatus 1 according to the invention for the plasma treatment of surfaces 2 has a first electrode 4, which is formed as a tube and in its interior forms a process gas channel 3. In this embodiment, the first electrode 4 and its enclosure coincide. During the operation of the apparatus, a process gas is directed through the process gas channel 3 with a low flow volume of for example 10 l/min and for each electrode or for each tip of the electrode. In a direction of flow that is aligned opposite to a direction of the height H, the process gas channel 3 ends in an outlet 5.

In FIG. 1, only an electrode tip 4a of the first electrode 4 is represented. The electrode tip 4a is produced completely from a conducting material, for example high-grade steel, iron or copper alloys, and is connected to an alternating voltage source 6. The alternating voltage source 6 generates an alternating or pulsed high voltage of 18 kV to 20 kV at a frequency of 1 kHz to 250 kHz. Apart from the first electrode 4, the alternating voltage source 6 is connected to earthed second electrodes 7. The second electrodes 7 are represented in section in FIG. 1.

The second electrodes 7 are formed as rods and arranged perpendicularly to the plane of the paper of FIG. 1 in a longitudinal direction L. The apparatus 1 in FIG. 1 merely represents an isolated configuration of an electrode tip 4a and two second electrodes 7 alongside the electrode tip 4a. The apparatus 1 as a whole has a multiplicity of electrode tips 4a, which are arranged one behind the other in a row in the longitudinal direction L. The spacing of the electrode tips 4a from one another is equidistant, and two rod-shaped second electrodes 7 are arranged parallel to the longitudinal direction L of the row of electrode tips 4a. In FIG. 1, respectively represented in cross section on both sides of the row of electrode tips 4a there is a second rod-shaped electrode 7. Both second electrodes 7 are connected to the alternating voltage source 6. In addition, a number of rows of electrode tips 4a aligned in the longitudinal direction L are arranged along a direction of the width B, which runs parallel to the joining line between the two second electrodes 7 perpendicularly to the longitudinal direction L and perpendicularly to the direction of the height H, so that the rows of electrode tips 4a are arranged parallel to one another, and an earthed rod-shaped second electrode 7 is respectively provided between two adjacent rows of electrode tips 4a.

At the open ends of the tube-shaped electrode tip 4a, an electrical field forms when an alternating voltage is applied. Indeed, between the outer wall of the electrode tip 4a and the two second earthed electrodes 7 there forms an electrical field (not depicted) that is particularly strong at the outlet 5 of the electrode tip 4a. That is to say that during operation a particularly strong electrical field is formed at the outlet 5 of the electrode tip 4a. The field strength of the electrical field is so strong that it converts the stream of process gas leaving the outlet 5 into a stream of plasma. A plasma is understood here as being a mixture of various constituents that comprises highly excited atomic states, highly excited molecular states, ions and electrodes, but also unchanged constituents of the process gas. On account of the formation of the field lines in the direction of a surface 2 of a substrate 11, the plasma already moves in the direction of the substrate 11 as a result of being driven by the field.

The electrode tip 4a is however formed as a tube through which the process gas can flow, so that the process gas, the direction of flow of which is represented by an arrow, flows through the electrode tip 4a in the direction of the outlet 5, and the outlet 5 is directed in the direction of the surface 2 of the substrate 11, whereby the stream of process gas in the tube that is converted into a plasma as it passes through the outlet 5 is on the other hand additionally provided with a movement component in the direction of the surface 2 of the substrate 11.

The velocity of the stream of process gas is only of such a magnitude that in the electrode tip 4a there forms a laminar flow, which even after leaving the outlet 5 of the electrode tip 4a remains at least substantially laminar and is not swirled.

The earthed second electrodes 7 are enclosed by a non-conducting dielectric 8. The dielectric 8 prevents a sparkover between the electrode tip 4a and the earthed second electrodes 7 of the alternating or pulsed high voltage. While the alternating high voltage is applied, an alternating displacement of the charge carriers forms in the non-conducting dielectric 8, but no current flow of free charge carriers takes place, so that a current flow that is produced by a sparkover can be prevented.

The apparatus 1 in FIG. 1 also shows that the two earthed second electrodes 7 are arranged closer to an effective area 9 of the apparatus 1 than the outlet 5 of the electrode tip 4a. The field lines forming between the electrode tip 4a and the two earthed second electrodes 7 are in a direction towards the effective area 9. In FIG. 1, the substrate 11 with the surface 2 to be treated is represented in the effective area 9.

The effective area 9 of the apparatus 1 is the three-dimensional area in which the surface 2 of the substrate 11 is arranged and can be subjected to a desired and effective treatment by a stream of plasma emerging from the electrode tip 4a.

The process gas may be variously composed, according to requirements; in particular, it may be formed by a high proportion of nitrogen with minor additions of noble gases and water vapour, preferably 92.4 to 99.9% by volume of nitrogen, 0.1 to 10% by volume of noble gases and 0 to 2.5% by volume of water vapour being used to form the process gas. However, other process gases are also conceivable. In principle, all substances that are gaseous at room temperature (or somewhat lower) to 200° C., and may also have coating properties, can be added.

The surface 2 is activated by the plasma in the way described at the beginning, thereby bringing about an improvement in the adhesive bonding strength.

FIG. 2 shows a second embodiment of the apparatus 1 according to the invention for the plasma treatment of surfaces 2. In FIGS. 2 to 6, the same designations represent the same features as in FIG. 1.

Here, too, this is a schematic representation, which merely shows an electrode tip 4a and two earthed second electrodes 7 in cross section, the apparatus 1 as a whole also comprising here a plurality of electrode tips 4a arranged one behind the other in a row in the longitudinal direction L perpendicularly to the plane of the drawing, which have on both sides earthed second electrodes 7 running in the longitudinal direction L. In the direction of the width B, a number of rows of electrode tips 4a are in turn provided.

The electrode tip 4a of the second embodiment comprises the first electrode 4, which is arranged centrally in the process gas channel 3; the first electrode 4 is concentrically surrounded by an enclosure 12. The first electrode 4 and the enclosure 12 together form the first electrode tip 4a. As in the other embodiments too, the electrode tip 4a is formed as a circle in cross section perpendicularly to the direction of the height H.

In the second embodiment according to FIG. 2, the process gas flows opposite to the direction of the height H along the process gas channel 3 and leaves the electrode tip 4a from the outlet 5. By contrast with FIG. 1, the field lines now no longer form between the enclosure 12 and the earthed second electrodes 7, but instead between the first electrode 4, provided as a core 14 in the electrode tip 4a, and the two earthed second electrodes 7.

The process gas emerging at lower velocity crosses the field lines of the field formed by the alternating high voltage between the first electrode 4 and the two second electrodes 7 and is converted into a plasma, which moves in the direction of the surface 2 of the substrate 11 on the one hand as a result of being driven by the field, on the other hand also by the kinetic energy taken up from the process gas and reaches the surface 2 as plasma. The plasma activates the surface 2 of the substrate 11. The first electrode 4 protrudes a little from the outlet 5 of the electrode tip 4a along the direction of the height H.

Represented in FIG. 3 is an electrode tip 4a which, compared with the electrode tip 4a of the second embodiment, ends a little before the outlet 5 of the electrode tip 4a counter to the direction of the height H. The tip of the first electrode 4a is consequently arranged within the enclosure 12 of the first electrode 4. The enclosure 12 is brought up closer to the effective area 9 of the apparatus 1, so that the distance between the surface 2 of the substrate 11 and the outlet 5 turns out to be smaller than in the embodiment according to FIG. 2. As a result, a restricted and even more targeted activation of a limited area of the surface 2 of the substrate 11 can take place.

Represented in FIG. 4 is a fourth embodiment of the apparatus 1 for the plasma treatment of surfaces 2 that in turn only differs from the other embodiments in the type of construction of the electrode tip 4a. Here, the electrode tip 4a has a tube-shaped first electrode 4 and also the enclosure 12 that is concentric to the tube-shaped first electrode 4. The first electrode 4 is connected to the alternating voltage source 6, and is taken a little beyond the outlet 5 of the enclosure 12 in the direction of the surface 2 of the substrate 11 along the direction of the height H. In the embodiment according to FIG. 4, the outlet 5 of the first electrode 4 has two different outlet heights 5a, 5b, which are at different distances away from the surface 2 and the effective area 9. The one outlet height 5a is formed by an outlet of the tube-shaped first electrode 4, a further outlet height 5b is formed by the outlet of the tube-shaped enclosure 12 of the first electrode 4. The process gas channel 3 is provided in the interior of the first electrode 4, while an annular further process gas channel 13 is arranged between the outer wall of the first electrode 4 and the inner wall of the enclosure 12. Emerging from the two outlet heights 5a, 5b of the electrode tip 4a, both the process gas from the process gas channel 3 and that from the further process gas channel 13 are converted into a plasma and reach the surface 2 of the substrate 11 both as a result of being driven by the field and being driven by the kinetic energy of the process gas itself.

In the fifth embodiment of the apparatus 1, represented in FIG. 5, the electrode tip 4a of FIG. 4 has in turn been modified to the extent that the enclosure 12 is made longer counter to the direction of the height H and is brought up closer to the surface 2 of the substrate 11. The first outlet height 5a of the tube-shaped first electrode 4 is now further away from the surface 2 of the substrate 11 than the second outlet height 5b of the enclosure 12. In comparison with the fourth embodiment, the distance between the second outlet height 5b and the surface 2 is much smaller. As a result, it is possible to apply the plasma to the surface 2 of the substrate 11 in a concentrated narrower area. Otherwise, the apparatuses 1 of FIGS. 4 and 5 correspond to those of FIG. 1.

In FIG. 6, a further embodiment of the earthed second electrodes 7 of FIGS. 1 to 5 is represented in a perspective view. The second electrodes 7 have the conducting core 14, which is formed as a rod and is connected to the earthed ground potential of the alternating voltage source 6. The core 14 is completely enclosed by a gas-tight inner layer 15, and the inner layer 15 is enclosed by an annular gas channel 16 at a distance from a porous outer layer 17. A stream of gas identified by an arrow is directed through the annular gas channel 16. The stream of gas has the purpose of preventing, or at least reducing, deposits of the plasma on the second electrodes 7. Molecules of the gas migrate through the porous outer layer 17 from the earthed second electrodes 7. The emerging gas molecules prevent deposition of the constituents of the process gas that are reflected from the surface 2 of the substrate 11 or reach the second electrodes 7 in some other way. As a result, the lifetime of the second electrodes 7 can be increased considerably.

LIST OF DESIGNATIONS 1 apparatus
2 surface
3 process gas channel
4 first electrode
4a electrode tip
5 outlet
5a outlet height
5b outlet height
6 alternating voltage source
7 second electrode
8 dielectric
9 effective area
11 substrate
12 enclosure
13 further process gas channel
14 core
15 gas-tight inner layer
16 annular gas channel
17 porous outer layer
B direction of width
H direction of height
L longitudinal direction

The invention claimed is:

1. A method for the treatment of surfaces with plasma, the method comprising:
providing a first electrode as a rod or a tube;
providing second electrodes as rods, wherein each of the second electrodes is grounded and surrounded by a gas-permeable dielectric outer layer;
applying an alternating voltage between the first electrode and the second electrodes;
generating an electrical field at least between the first electrode and the second electrodes;
positioning a surface to be treated in front of the first electrode, wherein each of the second electrodes is arranged closer to the surface than the first electrode;
passing at least one stream of process gas at least one process gas channel such that the at least one stream of process gas impinges on the electrical field, the electrical field converts the at least one stream of process gas into a stream of plasma, the at least one stream of process gas leaves at least one outlet, provided at the end of the at least one process gas channel, in the direction of an effective area and the stream of plasma impinges on the effective area; and
flowing a stream of gas along the second electrodes and through the gas-permeable dielectric outer layer to the outside, wherein a core of each of the second electrodes is enclosed by a gas-tight inner layer that is enclosed by an annular gas channel positioned at a distance from the gas-permeable dielectric outer layer.

2. The method according to claim 1, further comprising:
flowing the stream of process gas around the outside of the first electrode when the first electrode is formed as the rod.

3. The method according to claim 1, further comprising:
flowing a further stream of process gas through the first electrode when the first electrode is formed as the tube.

4. The method according to claims 1, wherein an alternating electrical field is generated between the first electrode and the second electrodes.

\* \* \* \* \*